US012741445B2

(12) United States Patent
Lee et al.

(10) Patent No.: US 12,741,445 B2
(45) Date of Patent: Sep. 22, 2026

(54) METAL THIN FILM SUBSTRATE, TRANSPARENT DISPLAY COMPRISING SAME, METHOD FOR PATTERNING METAL THIN FILM SUBSTRATE, AND METHOD FOR MANUFACTURING TRANSPARENT DISPLAY

(71) Applicant: DONGWOO FINE-CHEM CO., LTD., Iksan-si (KR)

(72) Inventors: Jun-Gu Lee, Iksan-si (KR); Sung-Jin Noh, Iksan-si (KR); Ki-Joon Park, Iksan-si (KR); Cheol-Hun Lee, Iksan-si (KR)

(73) Assignee: DONGWOO FINE-CHEM CO., LTD., Jeollabuk-Do (KR)

(*) Notice: Subject to any disclaimer, the term of this patent is extended or adjusted under 35 U.S.C. 154(b) by 361 days.

(21) Appl. No.: 18/582,533

(22) Filed: Feb. 20, 2024

(65) Prior Publication Data

US 2024/0286382 A1 Aug. 29, 2024

(30) Foreign Application Priority Data

Feb. 27, 2023 (KR) ........................ 10-2023-0026286
Dec. 29, 2023 (KR) ........................ 10-2023-0196342

(51) Int. Cl.
*B32B 7/12* (2006.01)
*B32B 15/20* (2006.01)
(Continued)

(52) U.S. Cl.
CPC ................ *B32B 7/12* (2013.01); *B32B 15/20* (2013.01); *B32B 17/061* (2013.01); *C09J 7/10* (2018.01);
(Continued)

(58) Field of Classification Search
CPC ......... B32B 7/12; B32B 15/20; B32B 17/061; B32B 2255/06; B32B 2255/26; B32B 2307/306; B32B 2307/412; B32B 2307/554; B32B 2307/714; B32B 2307/748; B32B 2457/20; C09J 7/10;
(Continued)

(56) References Cited

U.S. PATENT DOCUMENTS 10,287,465 B2 * 5/2019 Tanaka ........................ C09J 7/38
2008/0102241 A1 * 5/2008 Yutou ........................ C09J 7/22
428/343
(Continued)

FOREIGN PATENT DOCUMENTS

KR 20150033879 A 4/2015
KR 20160108646 A 9/2016
(Continued)

*Primary Examiner* — Ibrahim A Khan
(74) *Attorney, Agent, or Firm* — BKRIP LLC

(57) ABSTRACT

The present disclosure relates to a metal thin film substrate including: a glass substrate; a pressure-sensitive adhesive layer formed on one surface of the glass substrate; and a metal layer formed on one surface of the pressure-sensitive adhesive layer, wherein the pressure-sensitive adhesive layer contains a silicone-based pressure-sensitive adhesive, a transparent display including the same, a method for patterning the metal thin film substrate, and a method for manufacturing the transparent display.

11 Claims, 3 Drawing Sheets

(51) Int. Cl.

| | |
|---|---|
| ***B32B 17/06*** | (2006.01) |
| ***C09J 7/10*** | (2018.01) |
| ***C09J 7/38*** | (2018.01) |
| ***H10W 70/05*** | (2026.01) |
| ***H10W 70/60*** | (2026.01) |
| ***H10W 70/692*** | (2026.01) |
| ***H10W 90/00*** | (2026.01) |

(52) U.S. Cl.

CPC ............... *C09J 7/38* (2018.01); *H10W 70/05* (2026.01); *H10W 70/60* (2026.01); *H10W 70/611* (2026.01); *H10W 70/692* (2026.01); *H10W 90/00* (2026.01); *B32B 2255/06* (2013.01); *B32B 2255/26* (2013.01); *B32B 2307/306* (2013.01); *B32B 2307/412* (2013.01); *B32B 2307/554* (2013.01); *B32B 2307/714* (2013.01); *B32B 2307/748* (2013.01); *B32B 2457/20* (2013.01); *C09J 2203/326* (2013.01); *C09J 2301/302* (2020.08); *C09J 2400/146* (2013.01); *C09J 2400/166* (2013.01); *C09J 2483/00* (2013.01)

(58) Field of Classification Search

CPC .. C09J 7/38; C09J 2203/326; C09J 2301/302; C09J 2400/146; C09J 2400/166; C09J 2483/00; H10W 70/05; H10W 70/60; H10W 70/611; H10W 70/692; H10W 90/00

See application file for complete search history.

(56) References Cited

U.S. PATENT DOCUMENTS

| | | | | |
|---|---|---|---|---|
| 2011/0193103 | A1* | 8/2011 | Sato | H10D 86/411 438/758 |
| 2016/0118416 | A1* | 4/2016 | Yamazaki | H10D 86/0212 257/43 |
| 2016/0282529 | A1* | 9/2016 | Miyata | G02B 5/208 |
| 2017/0101553 | A1* | 4/2017 | Takarada | G02B 5/3033 |
| 2018/0134930 | A1* | 5/2018 | An | C09J 7/20 |
| 2018/0314352 | A1* | 11/2018 | Wang | G06F 3/03547 |
| 2019/0355919 | A1* | 11/2019 | Lu | B32B 27/281 |
| 2022/0050228 | A1* | 2/2022 | Yano | C09J 7/29 |
| 2023/0099594 | A1* | 3/2023 | Matsumoto | C09J 7/38 428/339 |
| 2023/0102451 | A1* | 3/2023 | Matsumoto | C09J 7/10 156/332 |
| 2024/0222387 | A1* | 7/2024 | Kim | H10D 86/60 |

FOREIGN PATENT DOCUMENTS

| | | | |
|---|---|---|---|
| KR | 20190003025 | A | 1/2019 |
| KR | 20220119926 | A | 8/2022 |
| KR | 102490505 | B1 | 1/2023 |

* cited by examiner

[FIG. 1]
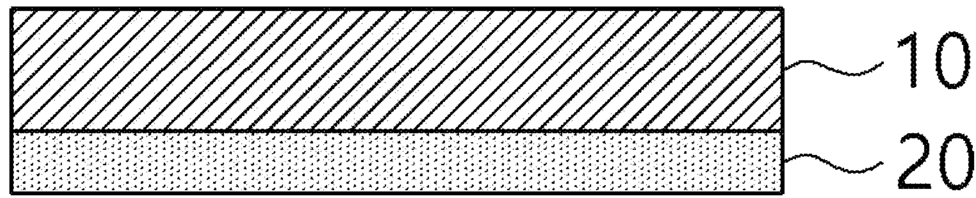
[FIG. 2]
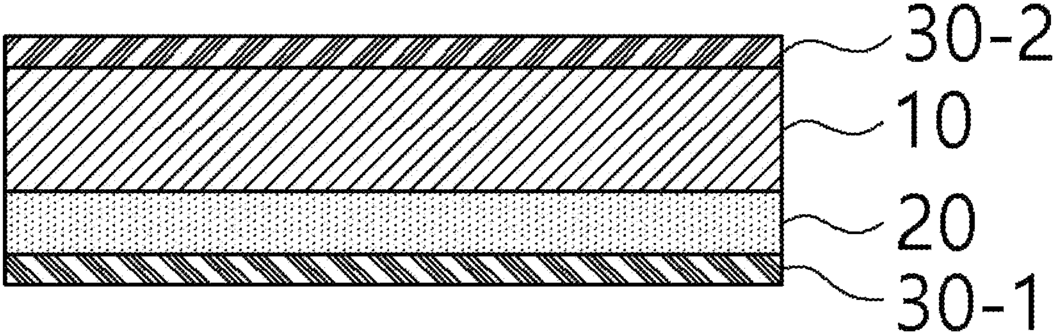
[FIG. 3A]
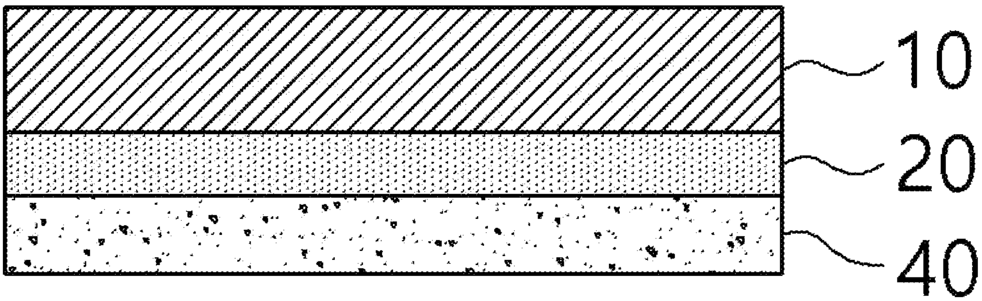

[FIG. 3B]
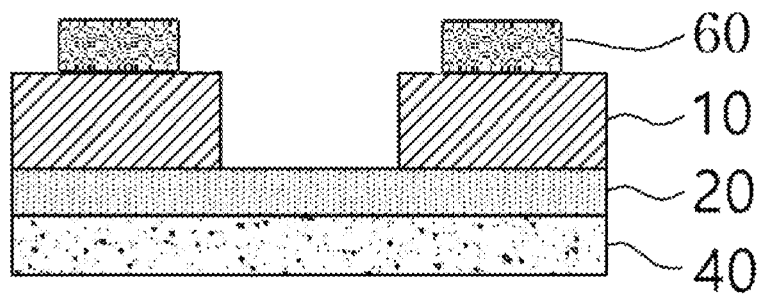
[FIG. 4]
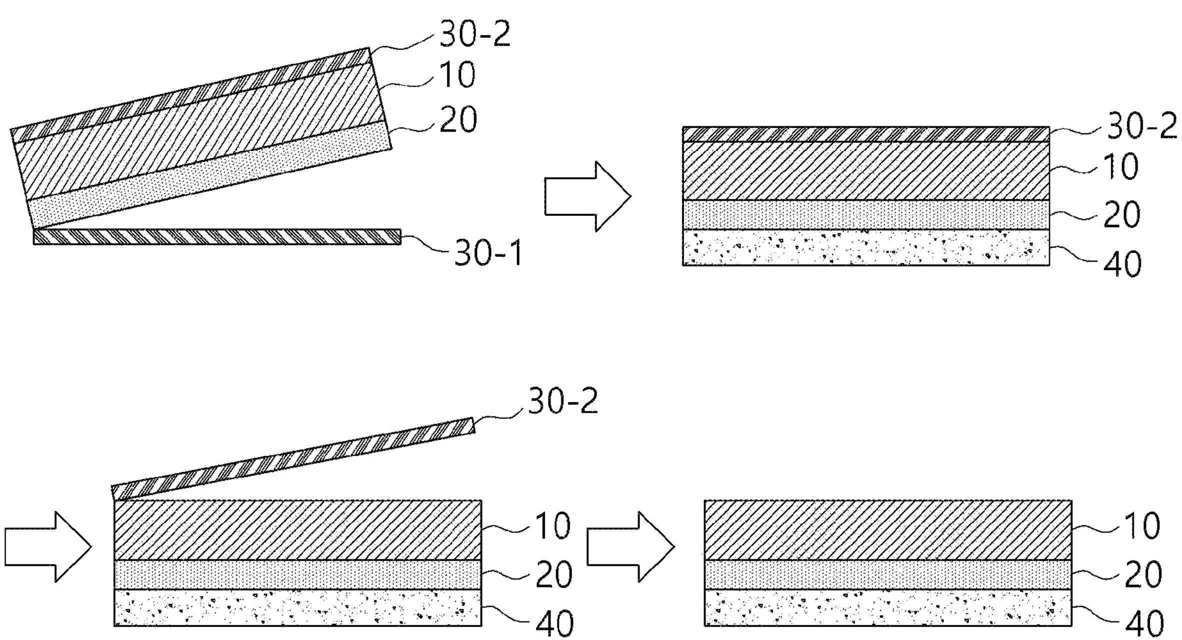

[FIG. 5]
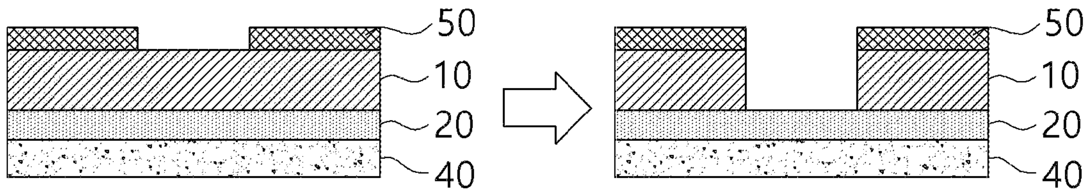
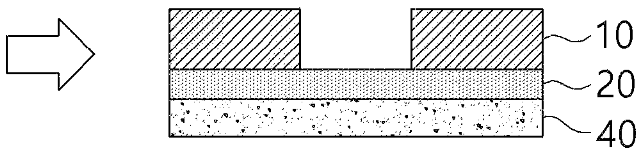
[FIG. 6]
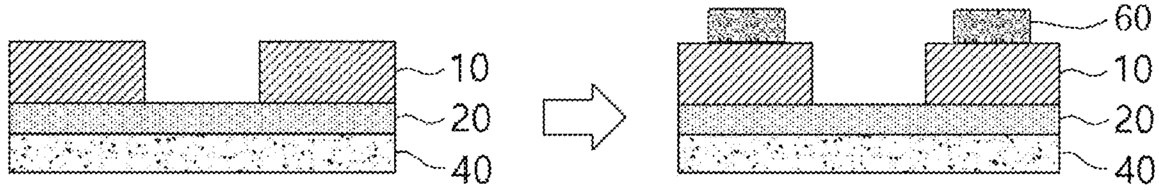

METAL THIN FILM SUBSTRATE, TRANSPARENT DISPLAY COMPRISING SAME, METHOD FOR PATTERNING METAL THIN FILM SUBSTRATE, AND METHOD FOR MANUFACTURING TRANSPARENT DISPLAY

TECHNICAL FIELD

The present disclosure relates to a metal thin film substrate, a transparent display including the same, a method for patterning the metal thin film substrate, and a method for manufacturing the transparent display.

BACKGROUND ART

Recently, the demand for large-area display devices according to advancement in technology in the display market is gradually increasing. Technology development is also gradually being made in the advanced electronic circuit and display business fields such as Micro-LED and Mini-LED, which can each adjust the contrast and brightness of unit area, and photolithography methods for manufacturing electronic devices for simultaneously satisfying high resolution and contrast ratio quality together with large-area sizes are being studied.

Korean Patent Publication No. 10-2019-0003025 also discloses a circuit board using a method of patterning a metal layer on the top of a glass substrate and a method for manufacturing the same.

However, various methods, such as plating or deposition of metal thin films, have been used as a method of implementing low-resistance metal wiring on conventional glass substrates, but each of these methods has limitations due to large-area of displays.

To overcome these limitations, attempts have recently been made to develop a technology for bonding a metal thin film to a glass substrate and then patterning the metal thin film using a photolithography method.

However, in such a method of bonding a metal thin film to a glass substrate, there have been problems in that not only adhesive force between the metal thin film and the glass substrate is not sufficient, but also the lower pressure-sensitive adhesive layer revealed after patterning the metal layer is damaged due to contact with the metal etchant.

Furthermore, especially when used in electronic devices exposed to the external environment for a long time, such as transparent displays, heat resistance and reliability in high temperature and high humidity environments are very important. However, in the case of acrylic pressure-sensitive adhesives or epoxy-based pressure-sensitive adhesives used in conventional metal thin films, there are problems in that not only heat resistance or reliability in high temperature and high humidity environments is not sufficient, but also curling is caused when a transparent display is implemented in a large-area.

Accordingly, since it is not only excellent in adhesive force to the glass substrate and chemical resistance to metal layer etchants, but also excellent in heat resistance and reliability in high temperature and high humidity environments, and does not curl even when applied to large-area glass, a need for metal thin film substrates applicable to large-area transparent displays is emerging.

RELATED ART DOCUMENT

Patent Document

Korean Patent Publication No. 10-2019-0003025

DISCLOSURE

Technical Problem

An object of the present disclosure is to provide a metal thin film substrate and a transparent display, which not only have excellent adhesive force to the glass substrate and wear resistance of the pressure-sensitive adhesive layer, but also have excellent chemical resistance to etchant, heat resistance and reliability, and do not curl even when applied to large-area glass so that they are applicable to large-area transparent displays.

Further, another object of the present disclosure is to provide a method for patterning the metal thin film substrate.

Further, another object of the present disclosure is to provide a method for manufacturing the transparent display.

Technical Solution

The present disclosure relates to a metal thin film substrate including: a glass substrate; a pressure-sensitive adhesive layer formed on one surface of the glass substrate; and a metal layer formed on one surface of the pressure-sensitive adhesive layer, wherein the pressure-sensitive adhesive layer contains a silicone-based pressure-sensitive adhesive.

In one embodiment of the present disclosure, the pressure-sensitive adhesive layer is formed from a pressure-sensitive adhesive layer composition including a silicone-based pressure-sensitive adhesive and a solvent, and the silicone-based pressure-sensitive adhesive may be contained in an amount of 40% to 60% of the total weight of the pressure-sensitive adhesive layer composition.

In another embodiment of the present disclosure, the silicone-based pressure-sensitive adhesive may include one or more types of a silicon compound and a siloxane compound.

In another embodiment of the present disclosure, the metal layer may have a thickness of 3 μm to 120 μm.

In another embodiment of the present disclosure, the metal layer may include one or more types selected from the group consisting of copper (Cu), aluminum (Al), nickel (Ni), chromium (Cr), silver (Ag), iron (Fe), gold (Au), cobalt (Co), titanium (Ti), and tungsten (W).

In another embodiment of the present disclosure, the pressure-sensitive adhesive layer may have a thickness of 5 μm to 50 μm.

In another embodiment of the present disclosure, the metal thin film substrate may not include a separate member between the metal layer and the pressure-sensitive adhesive layer.

In another embodiment of the present disclosure, the metal thin film substrate may be for a transparent display.

Furthermore, the present disclosure provides a transparent display including: the metal thin film substrate; and light emitting diodes (LEDs).

Furthermore, the present disclosure provides a method for patterning a metal thin film substrate, including steps of: forming a photoresist pattern on one surface of a metal layer provided on the metal thin film substrate; etching an exposed area of the metal layer by the photoresist pattern; and peeling off the photoresist pattern.

In one embodiment of the present disclosure, the etching step may be performed by an etchant containing one or more types selected from the group consisting of nitric acid, phosphoric acid, acetic acid, copper chloride, ferrous chloride, and ferric chloride.

Furthermore, the present disclosure provides a method for manufacturing a transparent display, including steps of: forming a metal pattern on one surface of a metal layer provided on the metal thin film substrate; and mounting light emitting diodes (LEDs).

Advantageous Effects

The metal thin film and metal thin film substrate according to the present disclosure can obtain effects that adhesive force to the glass substrate, chemical resistance to etchants, heat resistance, and reliability in high temperature and high humidity environments are excellent by being provided with a pressure-sensitive adhesive layer containing a silicone-based pressure-sensitive adhesive.

DESCRIPTION OF DRAWINGS

FIGS. 1 and 2 are views showing a metal thin film according to one or more embodiments of the present disclosure.

FIG. 3A is a view showing a metal thin film substrate according to one embodiment of the present disclosure.

FIG. 3B is a view showing one example of a transparent display according to one embodiment of the present disclosure.

FIG. 4 is a view showing a method for manufacturing a metal thin film substrate according to one embodiment of the present disclosure.

FIG. 5 is a view showing a method for patterning a metal thin film substrate according to one embodiment of the present disclosure.

FIG. 6 is a view showing a method for manufacturing a transparent display according to one embodiment of the present disclosure.

MODE FOR CARRYING OUT THE INVENTION

The present disclosure relates to a metal thin film and a metal thin film substrate which are provided with a pressure-sensitive adhesive layer containing a silicone-based pressure-sensitive adhesive, a method for manufacturing the metal thin film substrate, and a method for patterning the metal thin film substrate.

More specifically, the present disclosure relates to a metal thin film including: a metal layer; and a pressure-sensitive adhesive layer formed on one surface of the metal layer, wherein the pressure-sensitive adhesive layer contains a silicone-based pressure-sensitive adhesive.

Furthermore, the present disclosure relates to a metal thin film substrate including: a glass substrate; a pressure-sensitive adhesive layer formed on one surface of the glass substrate; and a metal layer formed on one surface of the pressure-sensitive adhesive layer, wherein the pressure-sensitive adhesive layer contains a silicone-based pressure-sensitive adhesive, a method for manufacturing the same, and a method for patterning the same.

Hereinafter, embodiments of the present disclosure will be described in more detail with reference to the drawings. However, the following drawings attached to this specification illustrate preferred embodiments of the present disclosure, and play a role of allowing the technical idea of the present disclosure together with the above-described contents of the invention to be further understood. Therefore, the present disclosure should not be construed as being limited only to the matters described in such drawings.

The terms used in this specification are for describing the embodiments and are not intended to limit the present disclosure. In this specification, singular forms also include plural forms unless specifically stated otherwise in the phrases. For example, "protective film" used in this specification may mean at least one protective film of a first protective film and a second protective film.

The term "comprises" and/or "comprising" used in this specification is used in the sense that it does not exclude the presence or addition of one or more other components, steps, operations and/or elements other than the stated component, step, operation and/or element. The same reference numerals refer to the same components throughout the specification.

Spatially relative terms ⌈below⌋, ⌈bottom surface⌋, ⌈bottom portion⌋, ⌈above⌋, ⌈top surface⌋, ⌈top portion⌋, etc. may be used to easily describe correlations of one element or components with another element or components as shown in the drawings. The spatially relative terms should be understood as terms including different directions of elements during use or operation in addition to the directions shown in the drawings. For example, when an element shown in the drawings is turned over, an element described as being below or bottom portion of other element may be placed above the other element. Accordingly, the exemplary term below may include both the below and above directions. Elements may also be oriented in other directions, and thus the spatially relative terms may be interpreted according to the orientation.

⌈Substantially⌋ used in this specification may be interpreted to include not only physically completely identical or matching, but also within the error range of measurement or manufacturing process, for example, an error range of 0.1% or less.

<Metal Thin Film Substrate>

The scope of the present disclosure is a metal thin film and a metal thin film substrate including the same.

The metal thin film of the present disclosure includes a metal layer and a pressure-sensitive adhesive layer, the pressure-sensitive adhesive layer contains a silicone-based pressure-sensitive adhesive, and the metal thin film substrate of the present disclosure may include a metal thin film formed on one surface of a glass substrate. More specifically, the metal thin film substrate of the present disclosure may include: a glass substrate; a pressure-sensitive adhesive layer formed on one surface of the glass substrate; and a metal layer formed on one surface of the pressure-sensitive adhesive layer. In particular, the pressure-sensitive adhesive layer of the present disclosure is characterized in that it contains a silicone-based pressure-sensitive adhesive, and accordingly, since the pressure-sensitive adhesive layer not only is excellent in adhesive force to the glass substrate and wear resistance of the pressure-sensitive adhesive layer, but also has excellent chemical resistance to etchants, heat resistance, and reliability, and does not curl even when applied to large-area glass, it has characteristics applicable to large-area transparent displays.

FIGS. 1 and 2 are views showing a metal thin film according to one or more embodiments of the present disclosure.

Referring to FIGS. 1 and 2, the metal thin film according to one or more embodiments of the present disclosure includes a metal layer 10 and a pressure-sensitive adhesive layer 20, and may further include a protective film 30 if necessary.

The metal layer 10 may be used as an electrode in an electronic device such as a display device including the metal thin film.

The metal layer 10 is not particularly limited as long as it has electrical conductivity, and may include, for example, one or more types selected from the group consisting of copper (Cu), aluminum (Al), nickel (Ni), chromium (Cr), silver (Ag), iron (Fe), gold (Au), cobalt (Co), titanium (Ti), and tungsten (W).

The metal layer 10 may be formed by a publicly known metal thin film process, and it may be formed using, for example, at least one method among electroless deposition, electrodeposition, sputtering, thermal evaporation, and E-beam evaporation, preferably electrodeposition, but the present disclosure is not limited thereto.

The metal layer 10 may have a thickness of 3 μm to 120 μm, preferably 3 μm to 110 μm, and more preferably 18 μm to 105 μm. If the thickness of the metal layer 10 is less than 3 μm, it may not be easy to form a uniform thin film or a pattern, and if it exceeds 120 μm, there may be a problem in that it cannot be applied to an electronic device with a thin film structure.

The pressure-sensitive adhesive layer 20 may be provided to enable the metal thin film to be used as a metal thin film substrate by combining it with another member, for example, a glass substrate to be described later.

The pressure-sensitive adhesive layer 20 is characterized in that it contains a silicone-based pressure-sensitive adhesive. Specifically, there has been a problem in that a metal thin film including a pressure-sensitive adhesive layer formed using a conventional acrylic pressure-sensitive adhesive or an epoxy-based pressure-sensitive adhesive does not have sufficient adhesive force to a glass substrate, or the pressure-sensitive adhesive layer is damaged by an etchant used to etch the metal layer formed on the top of the pressure-sensitive adhesive layer. Furthermore, when used in products that are mainly used outdoors, such as in the case of transparent displays, there has been a problem in that adhesive force of the pressure-sensitive adhesive layer to the glass substrate is reduced or yellowing of the pressure-sensitive adhesive layer occurs to cause product defects.

In order to solve such problems, the inventor of the present disclosure derived the present disclosure by taking notice of the point that, when the pressure-sensitive adhesive layer 20 contains a silicone-based pressure-sensitive adhesive, it not only has excellent adhesive force to the glass substrate excellent, but also has excellent chemical resistance to etchants, and has excellent heat resistance and reliability in high temperature and high humidity environments.

More specifically, the pressure-sensitive adhesive layer of the present disclosure may be manufactured from a pressure-sensitive adhesive layer composition including a silicone-based pressure-sensitive adhesive. The pressure-sensitive adhesive layer composition of the present disclosure includes a silicone-based additive and a solvent, and may further include an additive.

The silicone-based pressure-sensitive adhesive may be selected within a range that does not impair the purpose of the present disclosure, but may be one or more types of a silicon compound and a siloxane compound.

The silicon compound may be used without particular limitation as long as it is a compound containing silicon (Si) atoms. In addition, a compound containing a siloxane bond of a Si—O bond may be used without limitation as the siloxane compound. More specifically, in one example of the present disclosure, the silicon compound and the siloxane compound may be one type or more of trimethylated silica, vinyl terminated polydimethylsiloxane, hexamethyl di siloxane, trisiloxane, and tetrakis(trimethylsilyloxy)silane.

In particular, the silicone-based pressure-sensitive adhesive of the present disclosure is preferably contained in an amount of 40% to 60% of the total weight of the pressure-sensitive adhesive layer composition. As such, the silicone-based pressure-sensitive adhesive of the present disclosure may be diluted and added at a lower concentration than the conventional pressure-sensitive adhesive, and accordingly, when bonding the pressure-sensitive adhesive layer of the present disclosure to a metal layer or glass substrate, since adhesive force to the metal layer or glass substrate can be maximized, it has the advantage of enabling bonding even without additional treatment such as UV curing of the pressure-sensitive adhesive layer.

The solvent is not particularly limited as long as it can dilute the silicone-based pressure-sensitive adhesive, but examples thereof may include toluene, xylene, PGME, and/or PGMEA. The solvent of the present disclosure is preferably contained in an amount of 40% to 55% of the total weight of the pressure-sensitive adhesive layer composition in terms of stability of the pressure-sensitive adhesive coating thickness below the metal layer.

The additive may be one or more of an anchorage, a crosslinker, and a catalyst.

The anchorage is added for the purpose of increasing the bonding force with the metal layer when coating the pressure-sensitive adhesive layer, and can prevent the pressure-sensitive adhesive layer from being separated from the metal layer. Usually, there is no particular limitation as long as it is a material used as an anchorage, but it is preferable that thermal deformation does not occur at 200° C. or less.

The crosslinker is a material added for chemical bonding between components of the pressure-sensitive adhesive layer composition, and is preferably a product that does not undergo thermal deformation at 200° C. or less.

The catalyst is a component added to cure the pressure-sensitive adhesive layer composition and helps the pressure-sensitive adhesive layer composition to be transformed from a liquid phase to a solid phase. Specific examples thereof may include platinum catalysts, palladium catalysts, and/or osmium catalysts.

The additive of the present disclosure is preferably contained in an amount of 0.1% to 10% of the total weight of the pressure-sensitive adhesive layer composition in terms of adhesive force stability.

The pressure-sensitive adhesive layer 20 of the present disclosure may be formed by heating and curing the pressure-sensitive adhesive layer composition to a temperature of 100° C. to 180° C.

The pressure-sensitive adhesive layer 20 may have a thickness of 5 μm to 50 μm, preferably 5 μm to 30 μm, and more preferably 5 μm to 25 μm. If the thickness of the pressure-sensitive adhesive layer 20 is less than 5 μm, sufficient adhesive force to other members cannot be maintained, and if it exceeds 50 μm, there may be a disadvantage in terms of increased product thickness.

In one embodiment, the pressure-sensitive adhesive layer 20 may not include a separate member, for example, an intermediate layer or a protective layer, at the contact interface with the metal layer 10. Specifically, in the case of a pressure-sensitive adhesive layer formed using a conventional acrylic pressure-sensitive adhesive or an epoxy-based pressure-sensitive adhesive, there have been a problem that the pressure-sensitive adhesive layer is damaged by the etchant used to etch the metal layer formed on the top of the pressure-sensitive adhesive layer as described above. For example, in the case of a pressure-sensitive adhesive layer formed using an epoxy-based pressure-sensitive adhesive, there has been a problem such as an increase in opacity of the pressure-sensitive adhesive layer upon contact with the etchant. Therefore, the conventional metal thin film separately included a member of an intermediate layer or protective layer between the pressure-sensitive adhesive layer and the metal layer to prevent damage to the pressure-sensitive adhesive layer by the etchant. However, when such a separate member is included, there have been problems in that not only the processability deteriorates and the manufacturing cost increases due to the addition of a manufacturing process, but also it is disadvantageous in terms of thin film manufacturing. However, in the present disclosure, since a pressure-sensitive adhesive layer is formed using a silicone-based pressure-sensitive adhesive having excellent chemical resistance to etchants as described above and thus occurrence of damage to the pressure-sensitive adhesive due to the etchant is prevented so that the member of the intermediate layer or protective layer conventionally provided to protect the pressure-sensitive adhesive is not separately included, not only is processability improved, but also there is an advantage in terms of reduction in manufacturing cost, and further there is an advantage also in terms of thinning of the film.

The protective film 30 may be provided to protect the surface of the metal layer 10 and/or the pressure-sensitive adhesive layer 20 from the outside, and for example, the protective film 30 may be provided in forms of a first protective film 30-1 formed on one surface of the pressure-sensitive adhesive layer 20 in order to protect the surface of the pressure-sensitive adhesive layer 20 and a second protective film 30-2 formed on one surface of the metal layer 10 in order to protect the surface of the metal layer 10.

In one embodiment, the protective film may be used as a single-layer structure which is formed in one layer as shown in FIG. 2, but is not limited thereto, and may also be used as a multi-layer structure in which one or more protective films are continuously laminated.

In one embodiment, the protective film 30 may be one in which a second protective film 30-2 and a first protective film 30-2 are laminated on one surface of the metal layer 10 and the pressure-sensitive adhesive layer 20 using a laminator, respectively.

The protective film 30 is not particularly limited as long as it is for protecting the surface of the metal layer 10 and/or the pressure-sensitive adhesive layer 20, and it may include, for example, one or more types selected from the group consisting of polyethylene terephthalate (PET), polyethylene isophthalate (PEI), polyethylene naphthalate (PEN), polybutylene terephthalate (PBT), diacetyl cellulose, triacetyl cellulose (TAC), polycarbonate (PC), polyethylene (PE), polypropylene (PP), polymethyl acrylate (PMA), polyimide (PI), polymethyl methacrylate (PMMA), polyethyl acrylate (PEA), polyethyl methacrylate (PEMA), and cyclic olefin polymers (COP). In terms of ease of acquisition and processing convenience, polyethylene terephthalate (PET), triacetyl cellulose (TAC), polycarbonate (PC), polyimide (PI), and cyclic olefin polymers may be preferably used.

The thickness of the protective film 30 is not particularly limited and may be, for example, 10 μm to 200 μm.

Meanwhile, the metal thin film of FIG. 2 described above is an example of a metal thin film having a protective film 30 on one surface of the metal layer 10 and the pressure-sensitive adhesive layer 20, respectively, but is not limited thereto. For example, the metal thin film may include only one of a protective film formed on one surface of the metal layer and a protective film formed on one surface of the pressure-sensitive adhesive layer.

FIG. 3A is a view showing a metal thin film substrate according to one embodiment of the present disclosure.

Referring to FIG. 3A, a metal thin film substrate according to one embodiment of the present disclosure may include a metal layer 10, a pressure-sensitive adhesive layer 20, and a glass substrate 40.

In one embodiment, the metal thin film substrate may be manufactured using the metal thin film described above, and in this case, the same contents as those described in the metal thin film may be applied to the metal layer 10 and the pressure-sensitive adhesive layer 20.

The glass substrate 40 is not particularly limited as long as it does not impair the optical properties of the metal thin film substrate, and may include, for example, oxide glass such as silicate glass, borate glass, and phosphate glass. In this case, there is an advantage in the aspects that a heat shrinkage phenomena does not occur during subsequent processes, etc., and a predetermined hardness can be imparted to the metal thin film substrate.

In one or more embodiments, the glass substrate 40 may have a thickness of 1 mm to 20 mm. When the thickness of the glass substrate 40 satisfies the above range, the glass substrate 40 has excellent hardness and enables thinning, and occurrence of deformation or cracks in the metal layer 10 can be prevented. Specifically, when it is less than 1 mm, it may be difficult to protect the metal layer 10 or other laminated members from an external impact, and if it exceeds 20 mm, it may be disadvantageous in terms of thinning or weight reduction.

In one or more embodiments, the glass substrate 40 may have a single-layer or multi-layer structure. For example, as shown in FIG. 3A, it may have a single-layer structure formed of a single glass substrate, but is not necessarily limited thereto, and may also have a multi-layer structure in which a plurality of glass substrates are stacked.

In one embodiment, the pressure-sensitive adhesive layer 20 may have an adhesive force to the glass substrate 40 of 5 B or more. As described above, the pressure-sensitive adhesive layer 20 contains a silicone-based pressure-sensitive adhesive and is therefore characterized by having excellent adhesive force to the glass substrate 40.

In one embodiment, the adhesive force of the pressure-sensitive adhesive layer 20 to the glass substrate 40 may be evaluated by the measurement standard ISO 2409: Standard Test Methods for Measuring Adhesion by Tape Test.

<Method for Manufacturing Metal Thin Film Substrate>

The present disclosure relates to a method for manufacturing the metal thin film substrate of the present disclosure described above.

FIG. 4 is a view showing a method for manufacturing a metal thin film substrate according to one embodiment of the present disclosure.

Referring to FIG. 4, a method for manufacturing a metal thin film substrate according to one embodiment of the present disclosure may include steps of: peeling off a first protective film provided on a metal thin film; bonding the metal thin film so that a pressure-sensitive adhesive layer is disposed on one surface of a glass substrate; and peeling off a second protective film provided on the metal thin film.

Specifically, the step of peeling off the first protective film provided on the metal thin film may be peeling off a first protective film 30-1 disposed on the bottom surface of the pressure-sensitive adhesive layer 20 of the metal thin film.

Peeling of the first protective film 30-1 may be appropriately performed within a range that does not impair the purpose of the present disclosure, and a method used in the peeling process of a conventional release film may also be used.

The step of bonding the metal thin film so that the pressure-sensitive adhesive layer is disposed on one surface of the glass substrate may be bonding the surface of the pressure-sensitive adhesive layer 20 exposed to the outside as the first protective film 30-1 is peeled off to one surface of the glass substrate 40.

Bonding of the pressure-sensitive adhesive layer 20 and the glass substrate 40 may be appropriately performed within a range that does not impair the purpose of the present disclosure, and may be bonded using, for example, a laminator or the like.

The step of peeling off the second protective film provided on the metal thin film may be peeling off a second protective film 30-2 disposed on the top surface of the metal layer 10 of the metal thin film.

Peeling of the second protective film 30-2 may be performed by substantially the same method as peeling of the first protective film 30-1.

Meanwhile, the method for manufacturing the metal thin film substrate of FIG. 4 described above is explained by taking the method for manufacturing the metal thin film substrate using the metal thin film of FIG. 2 as an example, but is not necessarily limited thereto.

For example, in another embodiment of the present disclosure, when the metal thin film is not provided with the second protective film 30-2, the step of peeling off the second protective film provided on the metal thin film may be omitted.

<Method for Patterning Metal Thin Film Substrate>

The present disclosure relates to a method for patterning a metal thin film substrate, including a step of forming a metal pattern on the metal layer of the metal thin film substrate of the present disclosure described above.

The method for patterning a metal thin film substrate of the present disclosure includes steps of: forming a photoresist pattern on one surface of a metal layer provided on a metal thin film substrate; etching an exposed area of the metal layer by the photoresist pattern; and peeling off the photoresist pattern.

FIG. 5 is a view showing a method for patterning a metal thin film substrate according to one embodiment of the present disclosure.

Referring to FIG. 5, a method for patterning a metal thin film substrate according to one embodiment of the present disclosure may include steps of: forming a photoresist pattern on one surface of a metal layer provided on a metal thin film substrate; etching an exposed area of the metal layer by the photoresist pattern; and peeling off the photoresist pattern.

Specifically, the step of forming a photoresist pattern on one surface of a metal layer provided on a metal thin film substrate may include a process of applying a photoresist pattern forming composition to a metal layer 10 by spin coating, slit coating, inkjet printing, etc., a process of drying and heat-treating the applied photoresist pattern forming composition to form a photoresist film, and a process of selectively exposing and developing the photoresist film to dissolve and remove the photoresist film corresponding to the exposed or unexposed area, thereby forming a photoresist pattern 50.

The step of forming the photoresist pattern 50 may be performed by a publicly known method, and detailed contents will be omitted.

The step of etching an exposed area of the metal layer by the photoresist pattern is not particularly limited and may be performed by a dry etching process or a wet etching process.

In one embodiment, the wet etching process may be performed using an etchant containing one or more types selected from the group consisting of nitric acid, phosphoric acid, acetic acid, copper chloride, ferrous chloride, and ferric chloride. As described above, the pressure-sensitive adhesive layer 20 is characterized in that it contains a silicone-based pressure-sensitive adhesive, and it has excellent chemical resistance to an etchant containing one or more types selected from the group consisting of nitric acid, phosphoric acid, acetic acid, copper chloride, ferrous chloride, and ferric chloride. Therefore, when the etching process is performed by wet etching using an etchant containing one or more types selected from the group consisting of nitric acid, phosphoric acid, acetic acid, copper chloride, ferrous chloride, and ferric chloride, not only is the etching performance to the metal layer 10 excellent, but also, even if the pressure-sensitive adhesive layer 20 located at the bottom of the metal layer 10 is exposed to the etchant, no damage (physical/chemical damage and white clouding phenomenon, that is, turbidity or precipitation) to the pressure-sensitive adhesive layer 20 may occur.

The dry etching process or wet etching process may be performed by a publicly known method, and detailed contents will be omitted.

The step of peeling off the photoresist pattern may be performed using a method of immersing the substrate on which the resist pattern 50 is formed in a resist stripper, a method of spraying the stripper onto the relevant substrate, or the like. Further, in this case, physical treatments such as irradiation of ultrasonic waves or contact with a brush that rotates or swings side to side may be used together.

In one embodiment, the resist peeling conditions may include a temperature of about 15° C. to 100° C., preferably 30° C. to 70° C., and an immersion or spray time of preferably about 1 minute to 20 minutes, but are not limited thereto, and may be appropriately modified according to the user's needs.

In one embodiment, after the resist stripper treatment, a cleaning treatment may be additionally performed in order to remove the stripper remaining on the substrate. The cleaning treatment may be performed in the same manner as in the stripping process described above except that water or isopropyl alcohol is used instead of the stripper.

<Transparent Display and Manufacturing Method>

The present disclosure relates to a transparent display manufactured using the metal thin film substrate of the present disclosure described above and a method for manufacturing the same.

Specifically, the present disclosure relates to a transparent display including: the above-described metal thin film substrate; and light emitting diodes (LEDs). FIG. 3B is a view showing one example of a transparent display according to one embodiment of the present disclosure. Referring to FIG. 3B, the transparent display of the present disclosure is in a form in which light emitting diodes (LEDs) 60 are formed on a patterned metal layer 10 of a metal thin film substrate. More specifically, a solder layer (not shown) may be further included on the patterned metal layer 10 of the metal thin film substrate, and the light emitting diodes (LEDs) 60 may be mounted through the solder layer. The arrangement spacing or density of the light emitting diodes (LEDs) is not particularly limited, but may be arranged in a lattice form. In this case, the top, bottom, left, and right spacing may be 1 to 50 mm, and the spacing of the plurality of light emitting diodes (LEDs) may be the same as or different from each other. When forming the light emitting diodes (LEDs) on the metal thin film substrate of the present disclosure, there is an advantage as a transparent display capable of transmitting and reproducing images on a substrate having transparency.

In addition, a method for manufacturing a transparent display of the present disclosure includes steps of: forming a metal pattern on one surface of a metal layer provided on the above-described metal thin film substrate; and mounting light emitting diodes (LEDs). FIG. 6 relates to a method for manufacturing a transparent display according to one embodiment of the present disclosure, and is a view showing the step of mounting light emitting diodes (LEDs) 60 on the patterned metal layer 10 of the metal thin film substrate of the present disclosure.

In the present disclosure, the method for forming the light emitting diodes (LEDs) on the patterned metal layer of the metal thin film substrate of the present disclosure may include a method of surface mounting the device by soldering (SMT: Surface Mount Technology), but is not limited thereto.

The present disclosure relates to a structure further including an overcoat layer covering the top of the light emitting diodes (LEDs) or the entire transparent display, and a method for manufacturing the same. The overcoat layer may be made of conventionally known materials without limitation, and its thickness is also not particularly limited as long as it is at a level commonly applied to those skilled in the art.

As the metal thin film or metal thin film substrate of the present disclosure exhibits the above-described characteristics, it can be suitably used in display devices requiring large areas and low resistance, and in terms of particularly excellent heat resistance and reliability in high temperature and high humidity environments, it has the advantage of capable of being particularly suitably used in devices that may be exposed to the external environment for a long time such as transparent displays, etc.

Hereinafter, an Experimental Example including specific Examples and Comparative Examples are presented to aid understanding of the present disclosure, but the Experimental Example including specific Examples and Comparative Examples is only illustrative of the present disclosure and does not limit the scope of the appended claims, and it is obvious to those skilled in the art that various changes and modifications to the Examples are possible within the scope of the present disclosure and the scope of the technical spirit, and it is also natural that such changes and modifications fall within the scope of the appended claims. In addition, "%" and "part" indicating the content in the following are based on weight unless specifically stated.

Examples and Comparative Examples: Manufacturing of Metal Thin Film Substrate

(1) Example 1

After adding 4 kg of 99% toluene to 10 kg of a silicone-based pressure-sensitive adhesive (DOWSIL™ 96-083 Silicone Adhesive Kit, DOW; solid content of 70%) to prepare a composition with 50% of a silicone-based pressure-sensitive adhesive amount, the composition was stirred with a stirrer (5 horsepower), and then 0.5 g of an anchorage (SYL-OFF™ SL-9250, DOW) as an additive, 0.8 g of a crosslinker (SYL-OFF™ 7678, DOW), and 1 g of a platinum catalyst were further mixed to prepare an pressure-sensitive adhesive layer composition.

Thereafter, the pressure-sensitive adhesive layer composition was applied onto one surface of a copper metal substrate with a thickness of 30 μm by the gravure coating method, and then cured at 150° C. for 2 minutes to manufacture a metal thin film in which a silicone-based pressure-sensitive adhesive layer with a thickness of 10 μm was formed on one surface of the metal substrate.

Thereafter, the pressure-sensitive adhesive layer of the metal thin film was allowed to be disposed on one surface of a glass substrate with a thickness of 2 mm, and then the metal thin film was bonded using a sheet to sheet method to manufacture a metal thin film substrate.

Thereafter, the metal thin film substrate was patterned as shown in FIG. 5 to manufacture the metal thin film substrate of the Example.

(2) Example 2

A metal thin film substrate was manufactured in the same manner as in Example 1 except that the step of diluting the silicone-based pressure-sensitive adhesive by adding toluene to a silicone-based pressure-sensitive adhesive (DOWSIL™ 96-083 Silicone Adhesive Kit, DOW; solid content of 70%) in Example 1 was not performed, and the pressure-sensitive adhesive layer composition was applied onto one surface of a copper metal substrate, and then it was subjected to UV curing treatment under 150 mJ conditions and cured at 150° C. for 2 minutes.

(3) Example 3

A metal thin film substrate was manufactured in the same manner as in Example 1 except that the metal thin film was bonded using a roll to sheet method instead of the sheet to sheet method in Example 1.

(4) Comparative Example 1

A metal thin film substrate of Comparative Example 1 was manufactured in the same manner as in Example 1 except that an acrylic pressure-sensitive adhesive (ROBOND™ L-98D Water-Borne Adhesive, DOW) was used instead of the silicone-based pressure-sensitive adhesive in Example 1.

(5) Comparative Example 2

A metal thin film substrate of Comparative Example 2 was manufactured in the same manner as in Example 1 except that an epoxy-based pressure-sensitive adhesive (SCOTCH-WELD DP-410 EPOXY ADHESIVE, 3M) was used instead of the silicone-based pressure-sensitive adhesive in Example 1.

Experimental Example (1) Evaluation of Adhesive Force to Glass Substrate

For the metal thin film substrates of Examples and Comparative Examples above, the adhesive force of the pressure-sensitive adhesive layer to the glass substrate was evaluated according to the contents of the measurement standard ISO 2409: Standard Test Methods for Measuring Adhesion by Tape Test.

<Evaluation Criteria>

○: Adhesive force of 5 B or more

Δ: Adhesive force of not less than 3 B to less than 5 B x: Adhesive force of less than 3B (2-1) Evaluation of Chemical Resistance to Etchant (1)

The substrate was immersed in an etchant bath of 40° C. containing an etchant in which nitric acid, phosphoric acid, and acetic acid were mixed for 15 minutes, and then changes in the pressure-sensitive adhesive layer before and after input were observed.

<Evaluation Criteria>

○: There are not physical or chemical damage, or white clouding phenomenon at all in the pressure-sensitive adhesive layer Δ: There is no physical or chemical damage to the pressure-sensitive adhesive layer, but white clouding phenomenon occurs therein x: Occurrence of physical or chemical damage to the pressure-sensitive adhesive layer (2-2) Evaluation of Chemical Resistance to Etchant (2)

The substrate was immersed in an etchant bath of 40° C. containing a copper chloride etchant for 15 minutes, and then changes in the pressure-sensitive adhesive layer before and after input were observed.

<Evaluation Criteria>

○: There are not physical or chemical damage, or white clouding phenomenon at all in the pressure-sensitive adhesive layer Δ: There is no physical or chemical damage to the pressure-sensitive adhesive layer, but white clouding phenomenon occurs therein x: Occurrence of physical or chemical damage to the pressure-sensitive adhesive layer (3) Heat Resistance Evaluation The metal thin film substrates of Examples and Comparative Examples above were input into an oven at 200° C. for 30 minutes, and then the presence or absence of lifting phenomena(distortion or warping of the pressure-sensitive adhesive layer) between the glass substrate and the pressure-sensitive adhesive layer before and after input was observed.

<Evaluation Criteria>

○: No lifting phenomenon occurs on the glass substrate at all x: Lifting phenomenon occurs on the glass substrate (4) Reliability Evaluation The metal thin film substrates of Examples and Comparative Examples above were put into a chamber under conditions of 85° C. and 85% R.H. for 500 hours, and then the occurrence of color change and presence or absence of lifting phenomenon were observed.

<Color Change Evaluation Criteria>

○: No color change at all x: Yellowing phenomenon occurs

<Adhesive Force Evaluation Criteria>

○: No lifting phenomenon occurs on the glass substrate at all x: Lifting phenomenon occurs on the glass substrate (5) Wear Resistance Evaluation The metal thin film substrates of Examples and Comparative Examples above were evaluated using an abrasion resistance tester (SHIMADZU; AGS-X). Specifically, after fixing the metal thin film substrates of Examples and Comparative Examples to the stage, the Rubber Stick+750 g load was repeatedly moved left and right on the metal thin film substrates at 50 mm intervals to check the time point at which pushing (migration or smearing) of the pressure-sensitive adhesive on the metal thin film substrates occurred. This means that the faster the pushing occurs, the weaker the durability, and specifically, the evaluation was performed according to the following criteria, and the results are shown in Table 1.

<Wear Resistance (Abrasion Resistance) Evaluation Criteria>

○: No wear occurs even after 3000 cycles or more

Δ: Wear occurs after 140 cycles x: Wear occurs after 410 cycles (6) Curl Characteristic Evaluation For the metal thin film substrates of Examples and Comparative Examples above, after Soda Glass with a size of 1,250 mm×1,100 mm and a thickness of 1.1 T/1.8 T was laminated, it was heated at a temperature of 90° C. for 5 minutes, placed on a stone surface plate, and then subjected to dimension measurement using Gap-Gauge and spelling so that whether curling according to the bending radius(radius of curvature) occurred or not was confirmed based on the following criteria and the result is shown in Table 1.

○: Bending radius of 0 mm, no curling occurs

Δ: at bending radius of 1.0 mm or more, curling occurs x: at bending radius of 1.5 mm or more, curling occurs

TABLE 1

| Classification | Example 1 | Example 2 | Example 3 | Comparative Example 1 | Comparative Example 2 |
|---|---|---|---|---|---|
| Adhesive force evaluation | ○ | ○ | ○ | Δ | ○ |
| Chemical resistance evaluation (1) | ○ | ○ | ○ | ○ | Δ |
| Chemical resistance evaluation (2) | ○ | ○ | ○ | Δ | Δ |
| Heat resistance evaluation | ○ | ○ | ○ | X | ○ |
| Reliability evaluation (Color change) | ○ | ○ | ○ | X | X |
| Reliability evaluation (Adhesive force) | ○ | ○ | ○ | X | X |
| Wear resistance evaluation | ○ | Δ | ○ | X | Δ |
| Curl characteristic evaluation (1.1 T) | ○ | ○ | ○ | X | Δ |

TABLE 1-continued

| Classification | Example 1 | Example 2 | Example 3 | Comparative Example 1 | Comparative Example 2 |
|---|---|---|---|---|---|
| Curl characteristic evaluation (1.8 T) | ○ | ○ | ○ | X | Δ |

Referring to Table 1, it can be seen that the metal thin film substrates of Examples 1 to 3 containing a silicone-based pressure-sensitive adhesive not only have excellent adhesive force to the glass substrate, but also have excellent chemical resistance to etchants, heat resistance, and reliability in high temperature and high humidity environments. In addition, it was confirmed that curling did not occur even when the metal thin film substrates of Examples 1 to 3 were applied to large-area glass. In particular, in the case of Examples 1 and 3 in which a silicone-based pressure-sensitive adhesive was diluted and used, the wear resistance evaluation results were very excellent. If the pressure-sensitive adhesive wears easily, the pressure-sensitive adhesive layer revealed after metal etching may be easily damaged by even a small push or impact, but the metal thin film substrate of the present disclosure showed very excellent wear resistance as no wear occurred therein even after 3000 cycles or more.

Meanwhile, it can be seen that the metal thin film substrate of Comparative Example 1 containing an acrylic pressure-sensitive adhesive not only has poor adhesive force to the glass substrate compared to the Examples, but also has poor heat resistance. Furthermore, it can be seen that yellowing and lifting phenomena with the glass substrate occur in high temperature and high humidity environments so that there are problems in that reliability in the high temperature and high humidity environments is poor, and curling occurs when the metal thin film substrate of Comparative Example 1 was applied to large-area glass.

In addition, it can be seen that yellowing and lifting with the glass substrate in high temperature and high humidity environments occurred in the metal thin film substrate of Comparative Example 2 containing an epoxy-based pressure-sensitive adhesive so that reliability thereof is poor in the high temperature and high humidity environments.

In light of this, it can be seen that the metal thin film containing the silicone-based pressure-sensitive adhesive of the present disclosure and the metal thin film substrate manufactured using the same are mainly used outdoors such as in transparent displays so that they can be applied particularly suitably to technical fields requiring excellent heat resistance and reliability in high temperature and high humidity environments. In addition, since the metal thin film and the metal thin film substrate do not curl even when they are applied to large-area glass, they have the advantage of being applicable to large-area transparent displays.

EXPLANATION OF REFERENCE NUMERALS

10: Metal layer
20: Pressure-sensitive adhesive layer
30: Protective film
40: Glass substrate
50: Photoresist pattern
60: Light emitting diodes (LEDs)

The invention claimed is:

1. A metal thin film substrate comprising:
a glass substrate;
a pressure-sensitive adhesive layer formed on one surface of the glass substrate; and
a metal layer formed on one surface of the pressure-sensitive adhesive layer,
wherein the pressure-sensitive adhesive layer contains a silicone-based pressure-sensitive adhesive.

2. The metal thin film substrate of claim 1, wherein the pressure-sensitive adhesive layer is formed from a pressure-sensitive adhesive layer composition comprising a silicone-based pressure-sensitive adhesive and a solvent, and the silicone-based pressure-sensitive adhesive is contained in an amount of 40% to 60% of the total weight of the pressure-sensitive adhesive layer composition.

3. The metal thin film substrate of claim 1, wherein the silicone-based pressure-sensitive adhesive comprises one or more types of a silicon compound and a siloxane compound.

4. The metal thin film substrate of claim 1, wherein the metal layer has a thickness of 3 μm to 120 μm.

5. The metal thin film substrate of claim 1, wherein the metal layer includes one or more types selected from the group consisting of copper (Cu), aluminum (Al), nickel (Ni), chromium (Cr), silver (Ag), iron (Fe), gold (Au), cobalt (Co), titanium (Ti), and tungsten (W).

6. The metal thin film substrate of claim 1, wherein the pressure-sensitive adhesive layer has a thickness of 5 μm to 50 μm.

7. The metal thin film substrate of claim 1, wherein the metal thin film substrate does not comprise a separate member between the metal layer and the pressure-sensitive adhesive layer.

8. The metal thin film substrate of claim 1, wherein the metal thin film substrate is for a transparent display.

9. A transparent display comprising:
the metal thin film substrate of claim 1; and
light emitting diodes (LEDs).

10. A method for patterning a metal thin film substrate, comprising steps of:
forming a photoresist pattern on one surface of a metal layer provided on the metal thin film substrate of claim 1;
etching an exposed area of the metal layer by the photoresist pattern; and
peeling off the photoresist pattern.

11. The method of claim 10, wherein the etching step is performed by an etchant containing one or more types selected from the group consisting of nitric acid, phosphoric acid, acetic acid, copper chloride, ferrous chloride, and ferric chloride.

* * * * *